United States Patent [19]
Henley et al.

[11] Patent Number: 5,285,150
[45] Date of Patent: Feb. 8, 1994

[54] METHOD AND APPARATUS FOR TESTING LCD PANEL ARRAY

[75] Inventors: Francois J. Henley, Los Gatos; Michael J. Miller, Sunnyvale, both of Calif.

[73] Assignee: Photon Dynamics, Inc., Milpitas, Calif.

[21] Appl. No.: 618,183

[22] Filed: Nov. 26, 1990

[51] Int. Cl.$^5$ ...................... G01R 31/02; G01R 31/26
[52] U.S. Cl. ................... 324/158 R; 324/73.1; 324/158 T
[58] Field of Search .............. 324/158 R, 73.1, 158 T; 340/703, 793

[56] References Cited

U.S. PATENT DOCUMENTS

| | | | |
|---|---|---|---|
| 4,242,635 | 12/1980 | Burns | 324/158 R |
| 4,355,278 | 10/1982 | Burns et al. | 324/158 R |
| 4,776,022 | 10/1988 | Fox et al. | 358/106 |
| 4,819,038 | 4/1989 | Alt | 324/158 T |
| 4,843,312 | 6/1989 | Hartman et al. | 324/158 R |
| 4,868,492 | 9/1989 | Beha et al. | 324/158 R |
| 4,870,357 | 9/1989 | Young et al. | 324/158 R |
| 4,899,105 | 2/1990 | Akiyama | 324/158 R |
| 4,999,577 | 3/1991 | Beha et al. | 324/158 R |
| 5,017,755 | 5/1991 | Yahagi et al. | 219/121.75 |
| 5,034,683 | 7/1991 | Takahashi et al. | 324/158 R |

FOREIGN PATENT DOCUMENTS 0246727 10/1988 Japan ................ 324/158 P

OTHER PUBLICATIONS

Wisnieff et al. "In-Process Testing of Thin-Film Transistor Arrays" SID 90 Digest pp. 190-193.
"Unsurpassed Technology Resources, and Commitment Make Hitachi Your Best LCD Partner".
LUO, et al. "Testing and Qualifications of a-Si TFT-LC Color Cells for Military Avionics Applications" SID 90 Digest pp. 194-196.
Becker, et al. "Measurement of Electro-Optic Characteristics of LCDs" SID 90 Digest pp. 163-166.

Primary Examiner—Ernest F. Karlsen
Attorney, Agent, or Firm—Townsend and Townsend Khourie and Crew

[57] ABSTRACT

A hierarchical testing method is implemented taking advantage of the nature of the most common defects in an LCD panel to achieve fast effective parametric testing of LCD panels and the like. At the first hierarchy of testing, the panel is logically divided into zones and each zone tested in isolation to identify zones having at least one defect. At the next hierarchy, electro-optic assisted zone inspection is performed to identify where within the zone the defects are located. Lastly, every pixel is inspected using a voltage imaging method to determine whether the switching integrity of the pixel is acceptable. The testing apparatus includes a plurality of panel interface devices coupling the panel under test's drive lines and gate lines to a precision measurement unit (PMU). A controller determines the PMU signals and configures the panel interface devices. The PMU monitors select drive lines and gate lines to isolate zones having defects. An electro-optic voltage measurement system is used to identify the location of defects within an isolated zone.

5 Claims, 6 Drawing Sheets

METHOD AND APPARATUS FOR TESTING LCD PANEL ARRAY

CROSS REFERENCE TO RELATED APPLICATION

This invention is related to U.S. patent application Ser. No. 07/481,429 filed Feb. 15, 1990, now U.S. Pat. No. 4,983,911, issued Jan. 8, 1991, for VOLTAGE IMAGING SYSTEM USING ELECTRO-OPTICS. The content of that application is incorporated herein by reference and made a part hereof.

BACKGROUND OF THE INVENTION

This invention relates to high speed testing of high density display panel arrays, and more particularly to a method and apparatus for performing tests of high density panels such as LCD (Liquid Crystal Device) panels, using electro-optic assisted and non-contact methodologies.

LCD panels use either an active matrix panel technology or direct multiplex panel technology. Active matrix panels include an active component associated with each pixel enabling retainment of the pixel state after a refresh operation. As a result, contrast and flicker problems are minimized. Accordingly, active matrix panels are well-suited for large displays. Direct multiplex panels include relatively simple circuitry which enable dense pixel populations, but are subject to flicker in large arrays.

Figure 1:
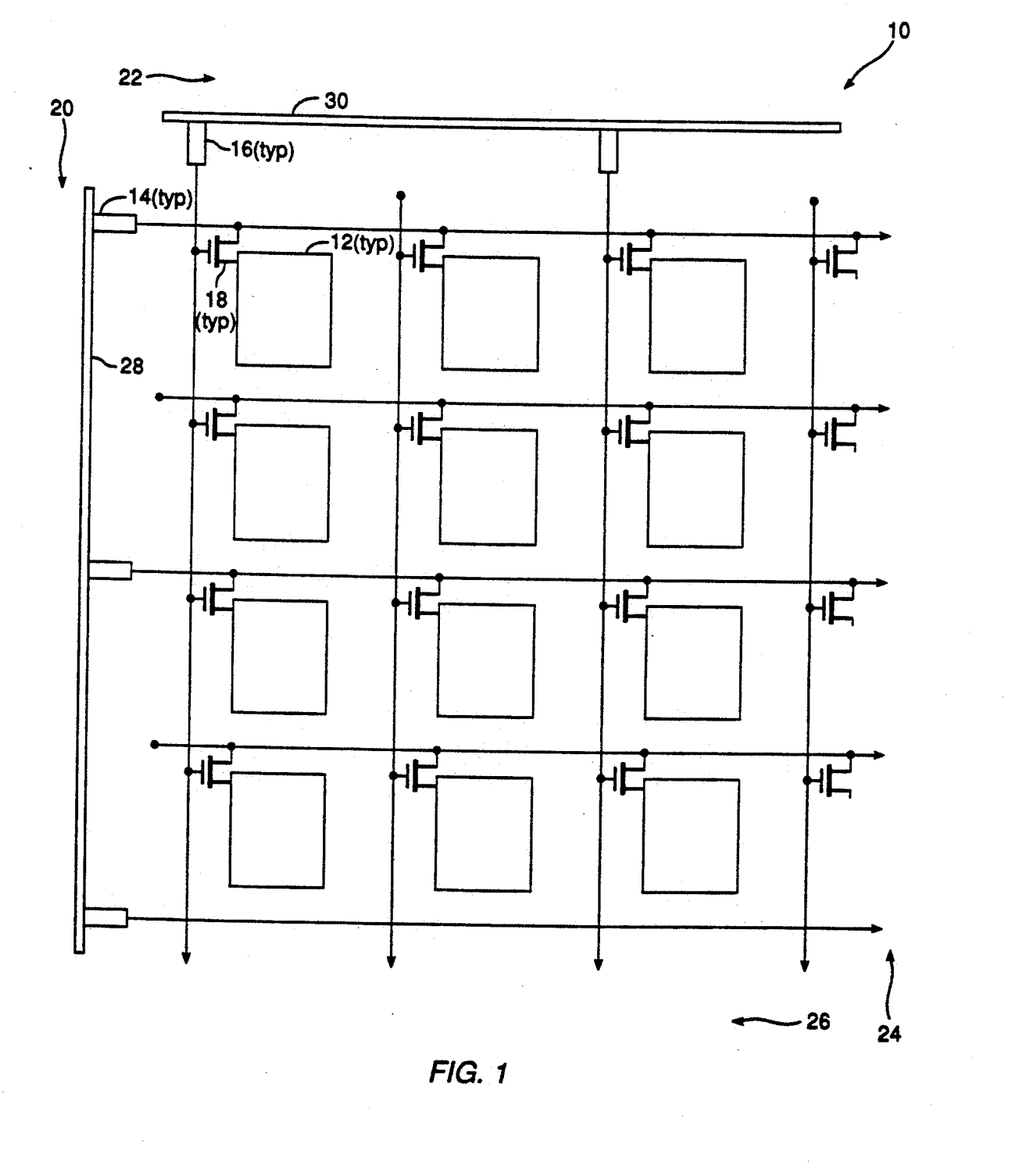
FIG. 1 is a block diagram illustrating a segment of an LCD panel array or panel under test (PUT)

Referring to FIG. 1, a typical active matrix LCD panel segment 10 is shown consisting of an array of pixels 12. Each pixel 12 is activated by addressing simultaneously an appropriate drive line 14 and gate line 16. A drive element 18 is associated with each pixel. The drive lines 14, gate lines 16, pixels 12 and pixel drive elements 18 are deposited on a clear glass substrate by a lithographic or similar process. Because of the high pixel densities, the close proximity of the gate lines and drive lines, and the complexity of forming the pixel drive elements (i.e. FET transistors), there is a significant probability of defects occurring during the manufacturing process.

Known testing methods for high density LCD panels include contact testing methodologies which require connection to and testing of each individual row/column intersection within the panel array. Advanced probing technology is necessary to establish reliable contacts among the densely populated pixel elements. Such test methods are time-consuming and prone to error. For an LCD array of 640 by 480 pixel elements, a typical test cycle requires approximately 300,000 connections and consumes about two hours. The time and expense of testing, although necessary, is a limiting factor to the commercial success of large array LCD panels. A faster and more efficient testing method is needed to reduce the testing costs, and thereby reduce the product costs of LCD panels so as to compete with CRT and other display types.

Accordingly, it is desireable to be able to test large arrays easily, without direct individual electrical connection and with connections only as needed.

SUMMARY OF THE INVENTION

According to the invention, a hierarchical testing strategy is implemented taking advantage of the nature of the most common defects in an LCD panel to achieve fast and effective parametric testing of LCD panels and the like. Since the most common defects for an LCD panel are cross shorts between a drive line and a gate line, testing for cross shorts is given highest priority.

At the top hierarchy of testing, the panel is logically divided into zones and each zone tested in isolation to identify zones having at least one cross short. At the next hierarchy, electro-optic assisted zone inspection is performed to identify where within the zone the cross shorts are located. At the lowest hierarchy, every pixel is inspected using a voltage imaging method to determine whether the switching integrity of the pixel is acceptable. The test hierarchy also may include an open circuit line-inspection test in which gate lines and drive lines are electro-optically inspected for the presence of defective open circuits.

According to one aspect of the invention each zone is isolated and tested (zone isolation testing) to detect the presence of one or more cross shorts in a manner that does not require individual connections to each pixel. Only the drive lines and gate lines at the periphery of the panel are electrically coupled to probe contacts. The probe contacts coupled to the drive lines are coupled electrically to panel interface circuits along one boundary or two opposing boundaries. Similarly, the contacts coupled to the gate lines are coupled electrically to other panel interface circuits along one or two boundaries orthogonal to the drive line boundaries. Each gate line panel interface circuit relays a common current signal to all the gate lines in a zone under test, while the corresponding drive line panel interface circuits are configured to monitor the corresponding drive lines. If a current is detected at the monitored drive lines, then the zone is identified as having a cross short.

According to another aspect of the invention, electro-optic assisted zone inspection is performed to identify the location of shorts within a zone. After selecting a zone known to have short circuits through the prior zone isolation tests, the panel interface circuits relay a voltage signal of +V to each of the drive lines of the selected zone and a voltage signal of −V to each of the gate lines of the selected zone. Using the electro-optic sensor, the voltages along the drive lines are electro-optically measured to determine whether the voltage is +V. The absence of the voltage +V is an indication that an error is present. Similarly, voltages along the gate lines are electro-optically measured to determine whether the voltage is −V. The absence of the voltage −V is an indication that an error is present.

As one short can result in many error detections, including real short and phantom short detections, a subsequent test is performed thereafter according to the invention if needed to identify any real shorts. For the subsequent inspection test, the panel interface circuits form a voltage divider in which each drive line receives a unique voltage signal and each gate line receives a unique voltage signal, distinct from the drive line voltage signals. The previously-identified gate and drive lines signified as having shorts then are remeasured and compared with predicted voltage signals to identify the precise location of the real short(s).

According to another aspect of the invention, an open circuit line-inspection test is performed. A voltage signal of +V is applied, for example, to even-numbered drive lines, while a ground signal is applied, for example, to odd-numbered drive lines. The voltages at the respective even line terminations opposite the contact probe connection then are measured electro-optically.

Lines that do not measure +V are identified as having an open circuit defect. The step is repeated with a +V voltage applied to the odd lines and ground to the even lines, and subsequently repeated again for testing the even and odd numbered gate lines. Accordingly, lines having an open circuit defect are identified. Binary search or image edge processing then may be used to isolate the location of the open circuit defect.

According to another aspect of the invention, a panel interface circuit is electrically coupled to a set of drive lines or gate lines at the respective line termination points along a boundary of the panel under test. The panel interface circuit is configurable to define high impedance signal paths and low impedance signal paths. The circuit also is configurable as a voltage divider network. During a zone isolation test, a panel interface circuit defining low impedance signal paths passes a signal from a test signal source to the coupled set of lines, while another panel interface circuit, also defining low impedance signal paths, passes response signals, if any, from the lines of the coupled set to a monitoring instrument. During a zone inspection test, the panel interface circuit is configured into high impedance signal paths and passes a common or unique test signal to each of the lines in the coupled set. A unique test signal is sent to each line by configuring the panel interface circuit into a voltage divider network. During an open circuit line-inspection test, the panel interface circuit is configured into high impedance signal paths and passes a common test signal to each tested line within the set of coupled lines. The interface circuit thus expedites the testing for panel defects.

The invention will be better understood by reference to the following detailed description taken in conjunction with the accompanying drawings.

DESCRIPTION OF THE PREFERRED EMBODIMENT

Panel Configuration

Referring to FIG. 1, a section of an LCD panel (PUT) 10 to be tested is shown including several pixel circuit elements 12. Associated with each pixel circuit element 12 is a drive line 14 and a gate line 16, as previously described. For a non-interdigitated panel (shown), each drive line 14 is terminated along a first panel boundary 17 and each gate line 16 is terminated along a second panel boundary 19 adjacent and generally orthogonal to the first boundary. By comparison, for an interdigitated panel every other drive line (i.e., even numbered) is terminated along one panel boundary, while the other drive lines (i.e., odd numbered) are terminated along the opposite, but parallel, boundary. Similarly, every other gate line (i.e., even numbered) is terminated along one panel boundary adjacent and generally orthogonal to the drive line panel boundaries, while the other gate lines (i.e., odd numbered) are terminated along the opposite panel boundary, also adjacent and generally orthogonal to the drive line panel boundaries.

A high density LCD panel for use as a display device for a computer system may be formed as an array of 640 pixels by 480 pixels. Each pixel in the panel can be identified by an address derived from the row number (i.e. 1 to 480) and column number (i.e. 1 to 640). Typically, for both the interdigitated and non-interdigitated configurations, there is one drive line per row and one gate line per column.

Panel Defects

It has been determined that the most common defects for high density panels are cross short circuits between a column gate line and a row drive line. In particular, the cross shorts are most likely to occur at the drive transistor between the gate and source or gate and drain. Short circuits between adjacent column lines or between adjacent row lines are unlikely because a pixel element is located between the adjacent column lines or row lines. The test methodology takes advantage of this characteristic to provide a quick and efficient testing methodology.

Test Apparatus Configuration

Figure 2:
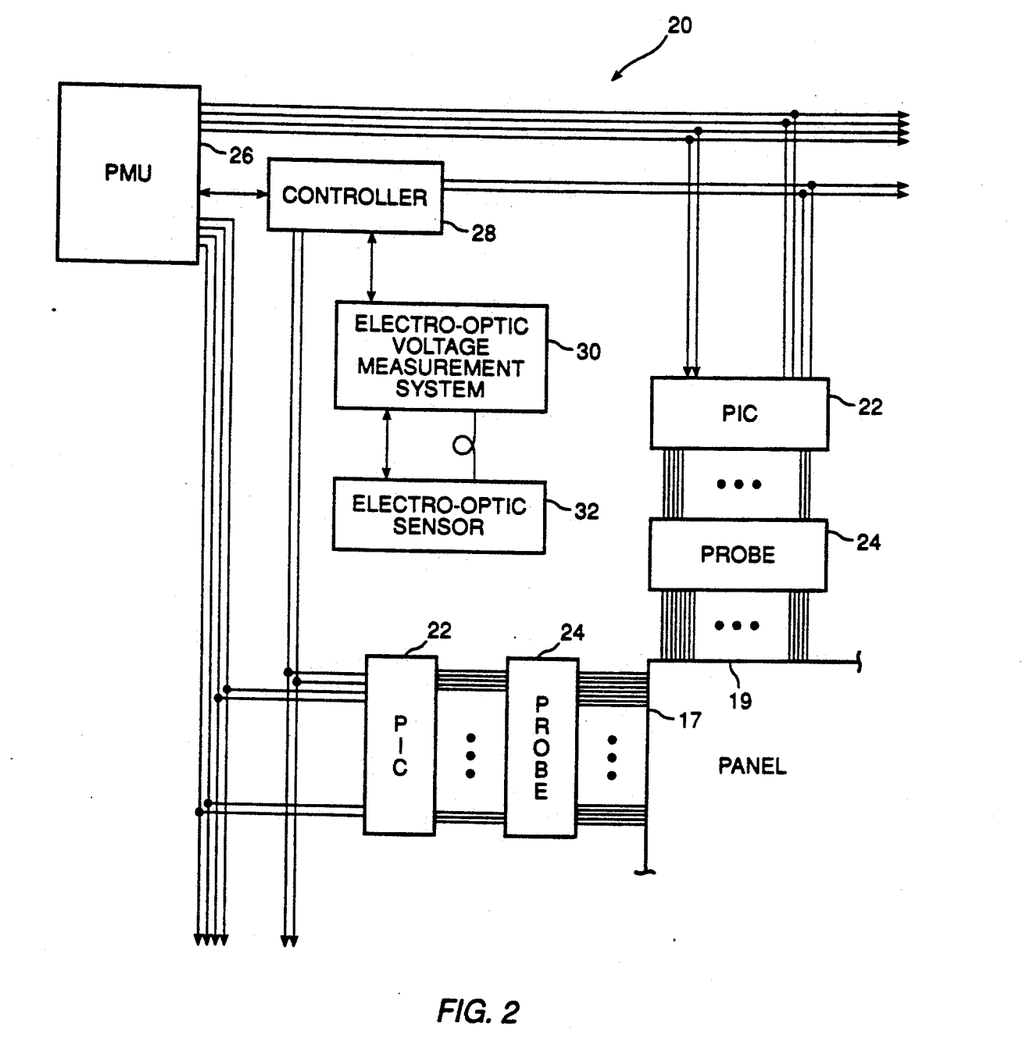
FIG. 2 is a block diagram of the test apparatus according to an embodiment of this invention.

Referring to FIG. 2, a test apparatus 20 according to this invention is shown, including panel interface circuits 22 (PICs) interfaced to the panel under test (PUT) 10 through respective probes 24. The panel interface circuit 22 relays signals from a conventional precision measurement unit (PMU) 26 to the drive lines 14 and gate lines 16 of the PUT 10. The panel interface circuits 22 also may relay signals from the drive lines 14 or gate lines 16 to the PMU 26. A test controller 28 is provided to control whether the PMU 26 provides or monitors test signals. An electro-optic voltage measurement system 30, such as described in the cross-referenced commonly owned U.S. application Ser. No. 07/481,429 filed Feb. 15, 1990 for VOLTAGE IMAGING SYSTEM USING ELECTRO-OPTICS, is also included for imaging the voltages along the drive lines or gate lines. The electro-optic system 30 includes an electro-optic sensor 32. The electro-optic sensor 32 allows the detection of electrical signals in an area without direct contact with the area.

Prior to testing, the PUT 10 is coupled to the test system 20 at the panel boundaries through contact probes 24. The probes 24 include, for example, 100 contacts for coupling to a one inch span of the panel boundary. The number of contacts and boundary span may vary.

Figure 3:
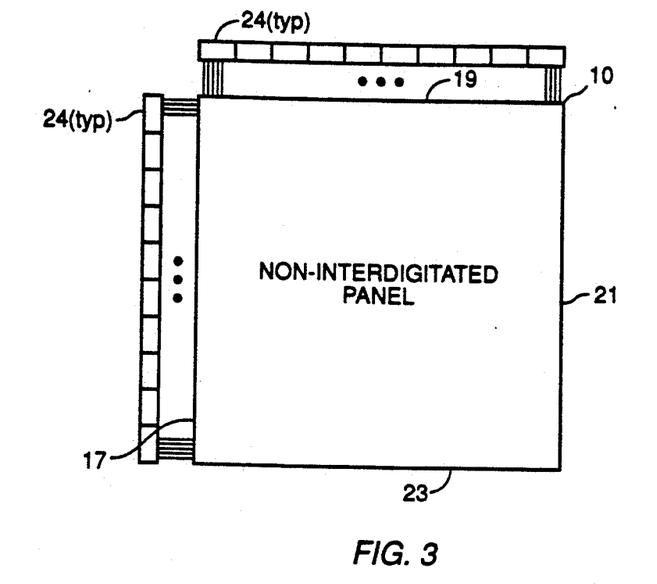
FIG. 3 is a block diagram of an LCD panel coupled to a configuration of contact probes for a non-interdigitated LCD panel.

Referring to FIG. 3, a 10-inch by 10-inch non-interdigitated panel of 640 by 480 pixels is depicted in which all the drive lines terminate along one boundary and all the gate lines terminate along another boundary. As a result, rows of panel interface circuits 22 (FIG. 2) and probes 24 are connected only to two boundaries 17, 19 of the panel. Based upon a probe 24 having a one-inch span, ten panel interface circuits 22 along one side boundary 17 are used to establish electrical coupling to all the drive lines through ten probes 24. Another ten panel interface circuits 22 along the top boundary 19 are used to establish electrical coupling to all the gate lines through another ten probes 24.

Within a one-inch span of the boundary either 48 drive lines or 64 gate lines terminate. Thus, one panel interface circuit 22 and probe 24 provide electrical links to 48 drive lines or 64 gate lines. The number of links varies depending on the span of the probe 24 and the number of drive lines 14 or gate lines 16 of the PUT 10 located within the span of the probe 24.

Figure 4:
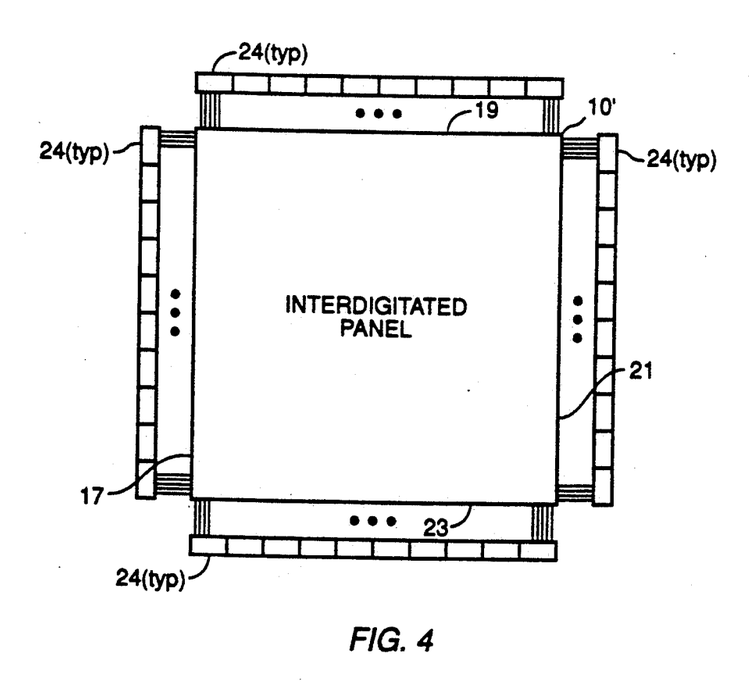
FIG. 4 is a block diagram of an LCD panel connected to a configuration of contact probes for an interdigitated LCD panel.

Referring to FIG. 4, a 10-inch by 10-inch interdigitated panel 10' having 640 by 480 pixels is depicted in which the even drive lines terminate along a first side boundary 17 and the odd drive lines terminate along the opposite side boundary 21, while the even gate lines terminate along the top boundary 19 and the odd gate lines terminate along the bottom boundary 23. Accordingly, panel interface circuits 22 and probes 24 are needed for all four boundaries. Based upon a one inch span probe, ten panel interface circuits are used along each boundary. Thus, 40 panel interface circuits are used to test the interdigitated panel 10', while 20 are used for the non-interdigitated panel 10 (FIG. 3). Within a one inch span of the boundary either 24 drive lines or 32 gate lines terminate. Thus, the 1 inch probe span would provide coupling to 24 drive lines or 32 gate lines.

Panel Interface Circuit Description

Figure 5:
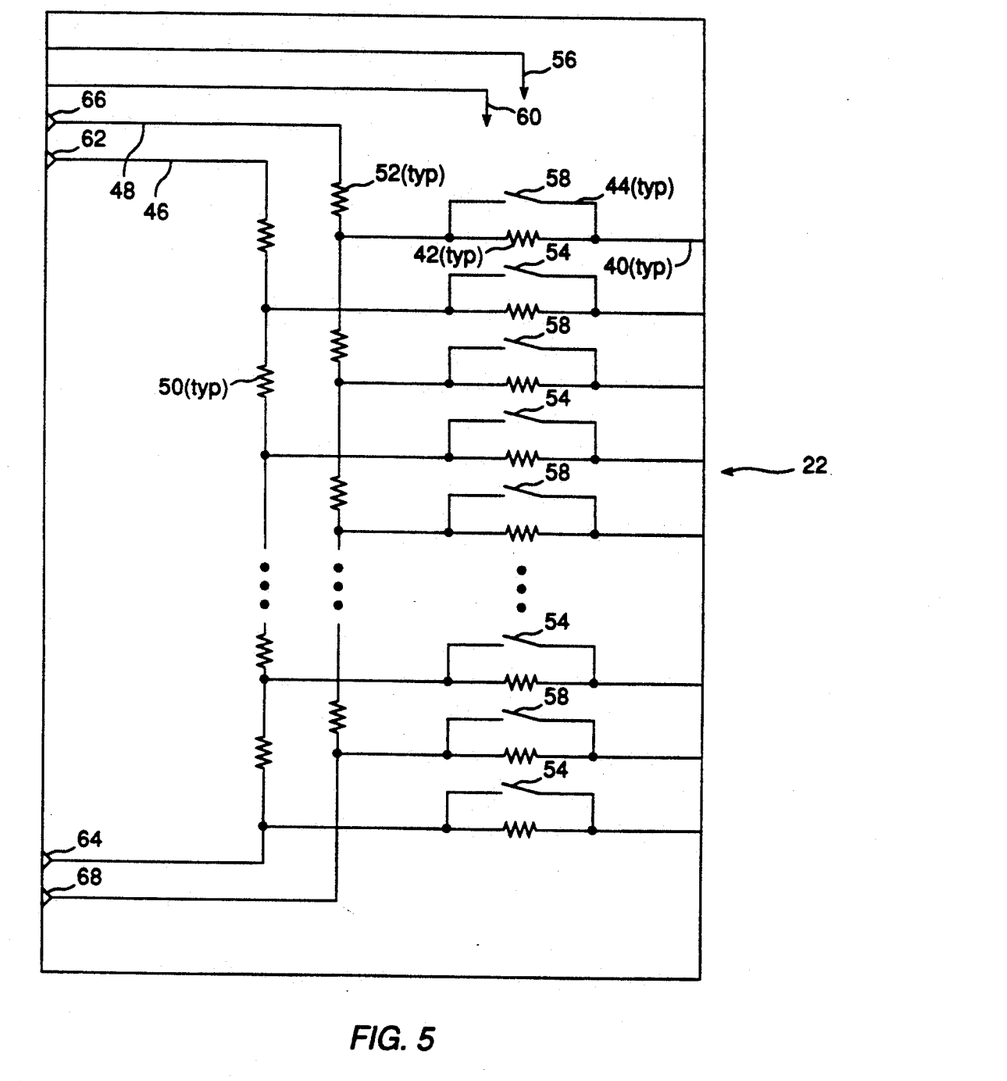
FIG. 5 is a schematic diagram of a panel interface circuit.

Referring to FIG. 5, a schematic of a panel interface circuit 22 is shown. The exemplary circuit 22 includes 100 channels 40, with one channel for each probe contact. Each channel 40 includes a high impedance resistor 42, such as a 50 kilohm to a 100 kilohm resistor, and a resistor bypass line 44. Alternate channels are connected into an even tap line 46 and an odd tap line 48. The even tap line 46 includes low impedance resistors 50, such as a 10 ohm to 50 ohm resistor, between each even channel line 40 connection. Similarly, the odd tap line 48 includes low resistance resistors 52 between each odd channel 40 line connection.

In a bypass mode, an electrical signal path is established through the bypass line 44 of each channel 40 to define a low impedance signal path. In a resistance mode, the electrical signal path is established through the high impedance resistor 42 to define a high impedance signal path. A switch 54 coupled to the controller 28 through signal path 56 is used to open or close the even channel bypass lines. Similarly, a switch 58 coupled to the controller 28 through signal path 60 is used to open or close the odd channel bypass lines.

The even tap line 46 has two termination points 62, 64 leading to respective PMU channels. Similarly, the odd tap line 48 has two termination points 66, 68 leading to respective PMU channels. The PMU 26 provides a ground signal, a voltage signal, a current signal, or a high impedance state at each termination point as determined by the controller 28. The high impedance state is used by the PMU 26 to monitor the signal at the corresponding even tap line 46 or odd tap line 48.

During the zone isolation tests, the panel interface circuits 22 are configured in the bypass mode. Some panel interface circuits receive a test current signal from the PMU, while others are monitored by the PMU. The panel interface circuits 22 receiving the test current signal, receive the same signal at each of the four termination points 62, 64, 66, 68. The panel interface circuits monitored have a high impedance level at each of the four termination points 62, 64, 66, 68.

During the zone inspection tests, the panel interface circuits 22 are configured in the resistive mode. For a first pass test, each panel interface circuit termination point 62, 64, 66, 68 receives the same voltage signal. For a second pass test, one end of each even tap line 46 and one end of each odd tap line 48 receives a common voltage signal, while the respective other ends receive a ground signal. As a result, the panel interface circuits 22 are configured as voltage dividers for the second pass test in which each channel relays a different voltage signal.

Test Hierarchy

A three-tier test hierarchy is described below to test the panel 10 for defects. The three testing tiers include: zone isolation testing, zone inspection testing and pixel inspection testing. Since drive line to drive line and gate line to gate line shorts are fairly unlikely, tests for such conditions are ignored. Testing for such short circuit defects, if desired, may be accomplished using conventional methods.

Zone Isolation Testing a. Zone Configuration

Figure 6:
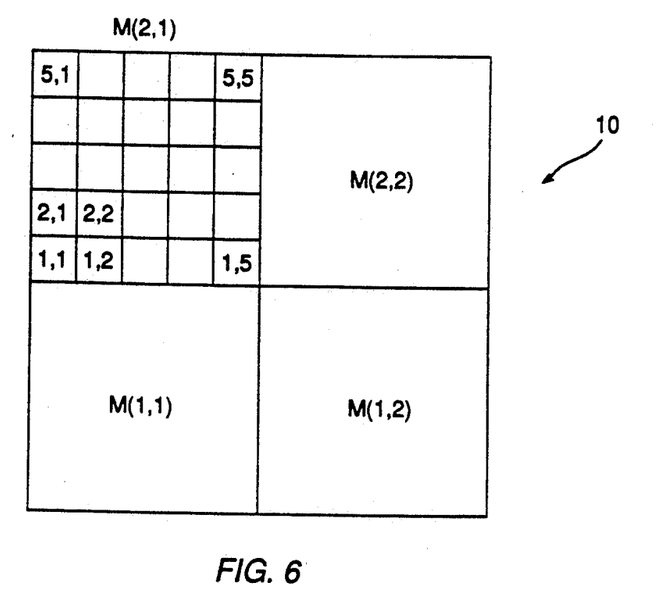
FIG. 6 is a block diagram illustrating an LCD panel logically divided into test zones.

The first tier of testing involves zone isolation testing, in which the panel under test is logically divided into test zones. Each zone then is tested to determine whether a cross short is present within the zone. As part of such zone isolation testing, the size of the zone may be decreased in iterative tests to more precisely define the zone in which a defect is present. For example, a 640 by 480 pixel panel 10 initially may be divided into four zones M(1,1), M(1,2), M(2,1) and M(2,2) as shown in FIG. 6. The zone isolation test may determine that only zone M(2,1) has a defect. Zone M(2,1) then might be reconfigured into five, twenty-five or another amount of zones. Referring to FIG. 6, Zone M(2,1) is shown divided into 25 sub-zones. Each of the smaller sub-zones then is tested in the same way the larger zone was tested to isolate which of the smaller zones include defects. For example, subsequent zone isolation may determine that only sub-zones (2,3) and (2,5) include defects. According to the example 98% of the panel 10 has been eliminated quickly from further cross short testing. Thus, by designing an appropriate test strategy, general areas having defects are identified quickly for further testing, while large portions of the panel are eliminated from further testing.

A preferable way of configuring zones is in multiples of probe contact 24 spans. Thus, for a 10-inch by 10-inch panel and a one-inch span probe, the panel 10 can be logically divided into 1 to 10 rows and 1 to 10 columns of zones. One zone (i.e. the entire panel), four zones (i.e. 2 rows, 2 columns), twenty zones (i.e. 10 rows, 2 columns), or one hundred zones (i.e. 10 rows, 10 columns) might be configured based upon the testing strategy.

As described above, one strategy may be to configure four zones and test them, then reconfigure the zones into smaller sub-zones (i.e., divide each of the four zones into 25 sub-zones) and test the sub-zones having defects.

Figure 7:
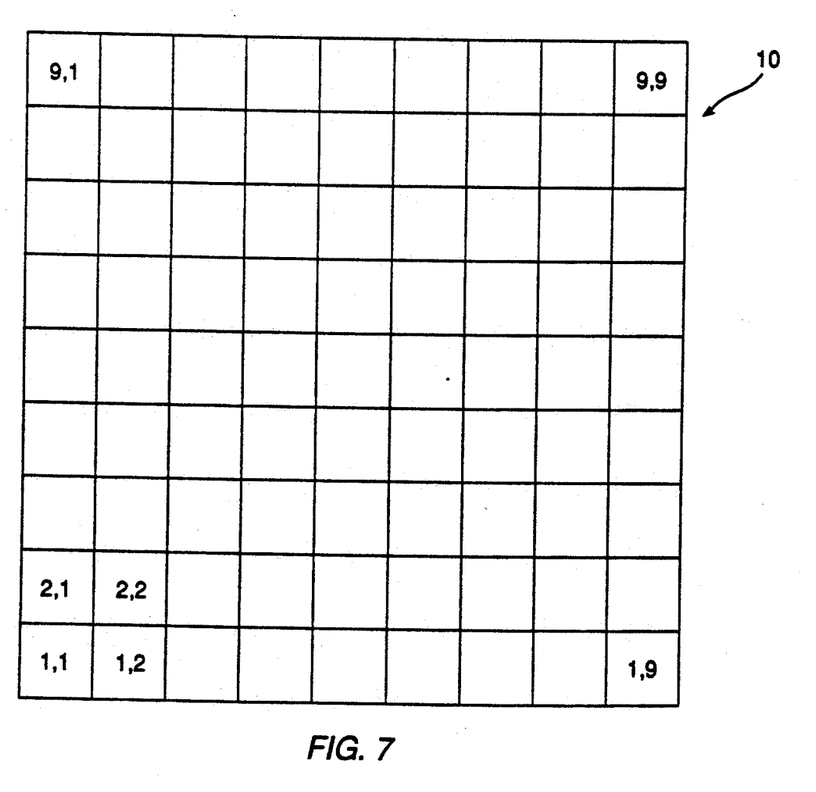
FIG. 7 is a block diagram illustrating an LCD panel logically divided into another set of test zones.

Referring to FIG. 7, a block diagram of an LCD panel 10 logically divided into 100 zones (i.e., 10 by 10) is shown. Each zone has an array address within the 10 by 10 domain. A zone (1,1) is shown, typical of each of the 100 zones, including 64 by 48 pixels (3,072 pixels). For the non-interdigitated panel, each panel interface circuit 22 along the side boundary 17 is coupled to 48 drive lines, while each panel interface circuit 22 along the top boundary 19 is coupled to 64 gate lines.

b. Testing a Selected Zone

Having described alternative zone configurations and zone testing strategies, the details of zone isolation testing for a selected zone now are described with reference to FIGS. 1 and 2.

Under control of the test controller 28, the panel interface circuits 22 are configured in the bypass mode and the PMU 26 is directed to output a test current signal to the panel interface circuits coupled to the gate lines 16 of a selected zone. The selected panel interface circuits 22 then relay the common test current signal from the PMU 26 to the gate lines 16. The controller 28, in addition, directs the PMU 26 to monitor the panel interface circuits 22 coupled to the drive lines 14 of the selected zone.

If the PMU 26 detects any current at the monitored drive lines, the current traveled across a gate line 16 onto a drive line 14. Accordingly, a cross short defect is present in the tested zone. The controller 28 flags the zone as having a defect so as to be tested again either in another series of zone isolation tests for smaller sub-zones of the defective zone or in subsequent zone inspection tests.

Zone Inspection Testing

Zone inspection testing now is described with reference to FIG. 2. Zone inspection is performed after zone isolation testing for each zone identified as having defects. A zone is selected for inspection, then tested with a first pass test and, if needed, with a second pass test.

For the first pass test, controller 28 configures each panel interface circuit 22 to the resistive mode and directs the PMU 26 to output a first voltage signal to each drive line panel interface circuit (i.e., panel interface circuit 22 along boundary 17) and a second voltage signal, distinct from the first voltage signal, to each gate line panel interface circuit (i.e., panel interface circuit 22 along boundary 19). Preferably, the PMU 26 generates a voltage signal input of +V to each of the drive lines 14 to be tested, while generating a voltage signal input of −V for each of the gate lines 16 to be tested. Such voltage signals are generated by inputting +V/2 at each of the tap line end points 62, 64, 66, 68 (FIG. 5) of the drive line panel interface circuits, and inputting −V/2 at each of the tap line end points 62, 64, 66, 68 (FIG. 5) of the gate line panel interface circuits. The panel interface circuits 22 relay the respective +V or −V voltage signal to each of the selected zone's drive lines 14 and gate lines 16, respectively.

The electro-optic voltage measurement system 30, such as described in the cross-referenced U.S. patent application Ser. No. 07/481,429 filed Feb. 15, 1990 for VOLTAGE IMAGING SYSTEM USING ELECTRO-OPTICS, measures the voltages at the corresponding gate lines 16 and drive lines 14 near the respective contact probes 24. If a drive line 14 does not have a voltage of +V, then a defect is present along the drive line 14. Similarly, if a gate line 16 does not have a voltage of −V, then a defect is present along the gate line 16.

If only one drive line 14 and one gate line 16 are found to have a defect, then the location of the cross short is known to be at the intersection of the drive line 14 and the gate line 16. However, if more than one drive line 14 and more than one gate line 16 are found to have defects, then the intersection points, in addition to defining at least one actual defect, may define one or more phantom defects which show up as defects, but are not actual defects.

Figure 8:
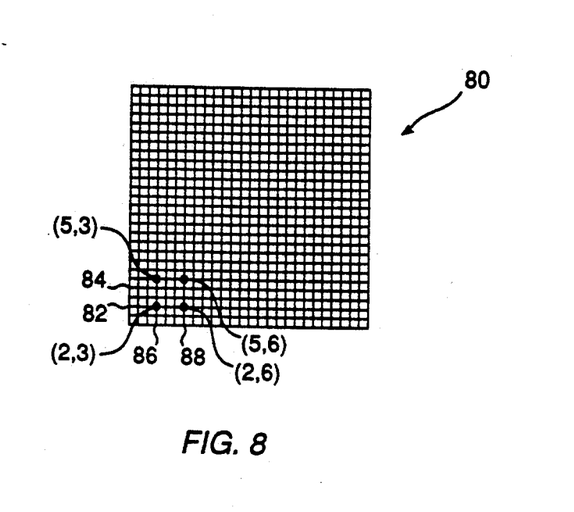
FIG. 8 is a block diagram of a test zone of a panel under test showing the array of intersecting drive lines and gate lines.

Referring to FIG. 8, the phantoms may occur when a zone 80 has 2 or more defects. For example, a zone 80 having 48 drive lines and 64 gate lines, may have actual defects at locations (2,3) and (5,6), where the first number is the drive line number and second number is the gate line number. During the first pass inspection tests, drive lines two (82) and five (84) are detected as having a defect and gate lines three (86) and six (88) are detected as having a defect. Thus, defects are found for locations (2,3), (2,6), (5,3) and (5,6). Two of these are actual defects and two are phantom defects.

When more than one drive line and gate line are identified, a second pass test is done to identify the actual defects. Referring to FIG. 2, the controller 28 configures the panel interface circuits 22 coupled to the zone under test 80 into the resistive mode. The controller 28 directs the PMU 26 to output to the appropriate drive line panel interface circuits 22 a first voltage signal at one termination point 62 of the even tap lines 46 and at one termination point 66 of the odd tap lines 48, while outputting a ground signal at the other termination points 64, 68. Similarly, the controller 28 directs the PMU 26 to output to the appropriate gate line panel interface circuits 22 a second voltage signal, distinct from the first voltage signal, at one termination point 62 of the even tap lines 46 and at one termination point 66 of the odd tap lines 48, while outputting a ground signal at the other termination points 64, 68. As a result, the panel interface circuits 22 are configured as voltage dividers. Thus, each drive line and gate line receives a unique voltage signal.

Figure 9:
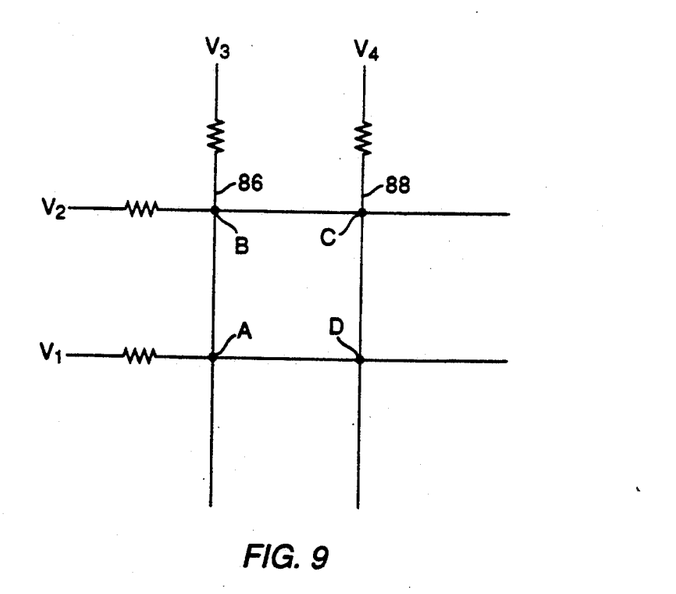
FIG. 9 is a schematic diagram depicting a pair of intersecting drive lines and gate lines receiving respective voltage signals.

Referring to FIG. 8, the voltages at the drive lines 82, 84 and gate lines 86, 88 identified in the first pass then are electro-optically measured again. Referring to FIG. 9, the applied voltage signals and intersection points of drive lines 82, 84, 86, and 88 are depicted. The measured voltage of a drive line 14 corresponds to the sum of the drive line's voltage and the voltage signals shorting to the drive line divided by the number of voltage signals forming the sum. For example, the voltage divider configuration may provide unique signals of +10 volts, +8 volts, −7 volts, −4 volts to the inspected drive lines 82, 84 and gate lines 86, 88, respectively. The voltage measured at drive line 82 for the example given (i.e., defects at (2,3) and (5,6)) then is +1.5 volts [(+10 −7) / 2=+1.5], while the voltage measured at drive line 84 is +2 volts [(+8 −4) / 2=+2].

Table A below shows the possible short combinations and corresponding measured voltage for measurements at two drive lines 82, 84 and two gate lines 86, 88. Note for certain combinations of shorts (3 or 4 of the 4 intersections being shorted), all the intersections are assumed to have shorts.

TABLE A

| Short at A | B | C | D | V at 1 | V at 2 | V at 3 | V at 4 |
|---|---|---|---|---|---|---|---|
|   |   | x | x | (V1 + V2 + V4)/3 | (V1 + V2 + V4)/3 | V3 | (V1 + V2 + V4)/3 |
|   | x |   | x | (V1 + V4)/2 | (V2 + V3)/2 | (V2 + V3)/2 | (V1 + V4)/2 |
|   | x | x |   | V1 | (V2 + V3 + V4)/3 | (V2 + V3 + V4)/3 | (V2 + V3 + V4)/3 |
|   | x | x | x | * | * | * | * |
| x |   |   | x | (V1 + V3 + V4)/3 | V2 | (V1 + V3 + V4)/3 | (V1 + V3 + V4)/3 |
| x |   | x |   | (V1 + V3)/2 | (V2 + V4)/2 | (V1 + V3)/2 | (V2 + V4)/2 |
| x |   | x | x | * | * | * | * |
| x | x |   |   | (V1 + V2 + V3)/3 | (V1 + V2 + V3)/3 | (V1 + V2 + V3)/3 | V4 |
| x | x |   | x | * | * | * | * |
| x | x | x |   | * | * | * | * |
| x | x | x | x | * | * | * | * |

\* = (V1 + V2 + V3 + V4)/4 (For this case, all four intersections are assumed to be shorted.)

The controller 28 has a table of the unique voltage signals applied to each drive line 14 and each gate line 16 and receives from the electro-optic voltage measurement system the measured voltage at the sampled drive line or gate line. The controller then compares the sampled voltage to a table of predicted voltages to determine the location(s) of defects. As discussed above, for certain combinations of cross shorts the measured voltage will be the same and thus shorts are flagged at each intersection of each of such combinations.

Open Circuit Defect Testing

Open circuit defect testing now is described with reference to FIGS. 2–5. Open circuits, though less common, also may be detected. Open circuit testing uses an electrooptical configuration similar to that described above for zone inspection.

During the open circuit tests, the controller 28 configures the panel interface circuits 22 into the resistive mode. For a non-interdigitated panel as shown in FIG. 3, the controller 28 then directs the PMU 26 to generate a first voltage signal (i.e. +V) at the even tap line 46 (FIG. 5) and a ground signal at the odd tap line 48 for every drive line panel interface circuit 22 along boundary 17. The opposite ends of the even drive lines away from the probes 24 along boundary 21 then are electro-optically monitored. Lines that do not measure at the first voltage signal level have an open circuit defect. The process then is repeated in which the odd-numbered drive lines are tested by receiving the first voltage signal, followed by the even-numbered gate lines, then the odd-numbered gate lines. For an interdigitated panel 10' as shown in FIG. 4, the lines coupled to the panel interface circuits along boundaries 17, 19, 21 and 23 are tested in the same manner as described for testing the lines of a non-interdigitated panel 10.

Having identified open circuit defects to the precise drive line or gate line, the precise location can be determined using a binary search or image edge processing technique.

Pixel Inspection Testing

The last tier of testing is pixel inspection. Based upon the first two tiers cross shorts locations are identified. Testing for open shorts also may have been done to locate open circuits to the corresponding drive line or gate line, and perhaps to the precise location. Only the pixels are left to be tested.

Pixel testing is performed by electro-optically imaging a panel area within the bounds of the electro-optic sensor 32. For a one inch by one inch crystal, the panel 10 is divided into one inch by one inch areas. Each area is tested by driving the pixels in the test area to a checkerboard state providing active and inactive circuit elements. The area then is imaged. The checkerboard states then are reversed so that the previously active elements now are inactive and the previously inactive elements now are active. The test area then is imaged again, and the state of each element compared to the prior state. Elements that do not change state are defective.

Although a preferred embodiment of the invention has been illustrated and described, various alternatives, modifications and equivalents may be used. For example, although the invention has been described for testing an LCD panel, other devices having an array of circuit elements may be tested. Therefore, the foregoing description should not be taken as limiting the scope of the invention which is defined by the appended claims.

What is claimed is:

1. A method for testing a panel array of circuit elements, each element coupled to a pair formed by a drive line and a gate line, each of the drive lines being coupled to one of two opposing first boundaries of the panel and each of the gate lines being coupled to second boundaries of the panel which are adjacent and generally orthogonal to said first boundaries, the panel being logically configurable into to test zones, the method comprising the steps of:

isolating the test zones having a cross short defect, each one of said test zones having a set of drive lines coupled to the first boundaries and a set of said gate lines coupled to the second orthogonal boundaries; and thereafter inspecting without establishing individual physical connections to each circuit element within said zone, one of said isolated test zones to identify the location of said cross short defect within said isolated zone by inputting a first voltage signal to said set of drive lines for the isolated zone and a second voltage signal, distinguishable from the first voltage signal, to said set of gate lines, for said isolated zone; thereupon for each drive line of said set of drive lines, electo-optically sampling voltage magnitude along each one of said drive lines by means of voltage imaging, wherein a difference between said sampled voltage and said first voltage signal signifies the presence of a defect along the electro-optically sampled drive line; and for each gate line of said set of gate lines, electro-optically sampling a voltage along each one of said gate lines, wherein a difference between said sampled voltage and said second voltage signal signifies presence of a defect along the electro-optically sampled gate line.

2. The method of claim 1 in which the step of inspecting an isolated zone further comprises the steps:
- inputting a different drive line input voltage signal to each drive line of said set of drive lines;
- inputting a different gate line input voltage signal to each gate line of said set of gate lines of, said gate line input voltage signals being distinguishable from said drive line input voltage signals; thereupon
- for each drive line previously signified as having a defect, electro-optically sampling voltage magnitude along each one of said drive lines; thereupon
- comparing said drive line sampled voltage magnitude of said each one of said signified drive lines with predicted voltages to identify a defect location; thereafter
- for each gate line of said set of gate lines, electro-optically sampling voltage magnitude along each one of said gate lines; and thereupon
- comparing said gate line sampled voltage of said each one of said signified gate lines with predicted voltages to indentify a defect location.

3. The method of claim 1 further comprising the steps:
- inputting a first probe voltage signal at a first end of every other drive line along the first boundary and inputting a second probe voltage signal, distinguishable from the first probe voltage signal, at a first end of remaining drive lines along said first boundary;
- for each drive line receiving said first voltage signal, electro-optically sampling a test voltage for each one of said drive lines at a second end opposite said first end, wherein a difference between said test voltage and said first probe voltage signal signifies the presence of an open circuit defect along the electro-optically sampled drive line.

4. The method of claim 1 wherein said inspection step comprises the step of:
- performing a pixel inspection of the isolated zone by electro-optically imaging said isolated test zone to establish the switching state of each pixel within the imaged area.

5. The method of claim 1 in which said first boundaries comprise two generally parallel panel boundary elements on opposite sides of said panel, and in which said second boundaries comprise two generally parallel panel boundary elements on opposite ends of said panel.

* * * * *